United States Patent [19]
Tsuruta et al.

[11] Patent Number: 5,204,282
[45] Date of Patent: Apr. 20, 1993

[54] SEMICONDUCTOR CIRCUIT STRUCTURE AND METHOD FOR MAKING THE SAME

[75] Inventors: Kazuhiro Tsuruta, Nishio; Seizi Huzino, Anjyo; Mitutaka Katada, Nishio; Tadashi Hattori, Okazaki; Masami Yamaoka, Anjyo, all of Japan

[73] Assignee: Nippon Soken, Inc., Nishio, Japan

[21] Appl. No.: 545,617

[22] Filed: Jun. 29, 1990

Related U.S. Application Data

[62] Division of Ser. No. 415,132, Sep. 29, 1989, abandoned.

[30] Foreign Application Priority Data

Sep. 30, 1988 [JP] Japan ................................ 63-248737

[51] Int. Cl.$^5$ .......................................... H01L 21/76
[52] U.S. Cl. ....................................... 437/62; 437/974; 148/DIG. 12; 148/DIG. 73
[58] Field of Search ............... 437/62, 86, 225, 974; 148/DIG. 12, 33.2, DIG. 135, DIG. 73, DIG. 86, DIG. 117

[56] References Cited
FOREIGN PATENT DOCUMENTS

| | | | |
|---|---|---|---|
| 1-189133 | 7/1989 | Japan | 437/62 |
| 2-5546 | 1/1990 | Japan | 437/62 |
| 2-18948 | 1/1990 | Japan | 437/62 |
| 2-83949 | 3/1990 | Japan | 437/62 |
| 2-119161 | 5/1990 | Japan | 437/62 |
| 2-16746 | 6/1990 | Japan | 437/62 |

Primary Examiner—George Fourson
Attorney, Agent, or Firm—Cushman Darby & Cushman

[57] ABSTRACT

A semiconductor circuit structure including a semiconductor substrate portion and at least one region provided on one main surface thereof insulatedly isolated from other regions provided on the same surface, by an burying means made of an oxide film, the burying means including a bottom flat portion and at least one side wall portion provided at least in the vicinity of an edge portion of and integrally formed with the bottom flat portion, thereby a semiconductor circuit structure provided with a plurality of insulatedly isolated regions on a main surface thereof and having a high withstand voltage can be obtained in a short production process.

13 Claims, 6 Drawing Sheets

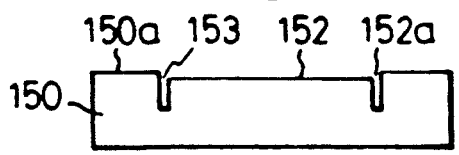
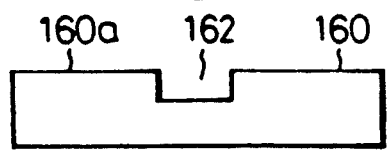
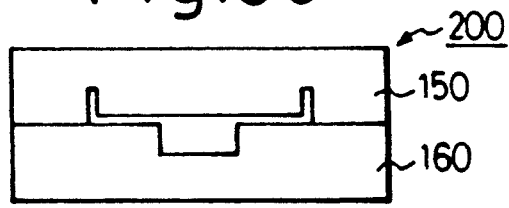
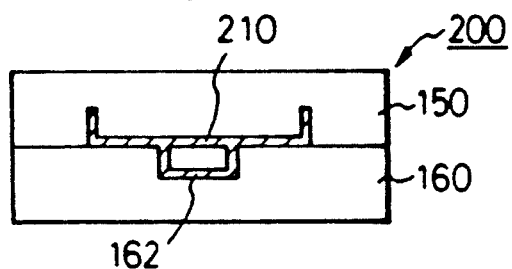
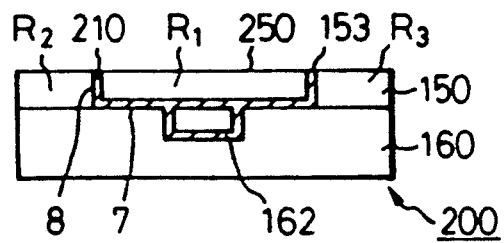

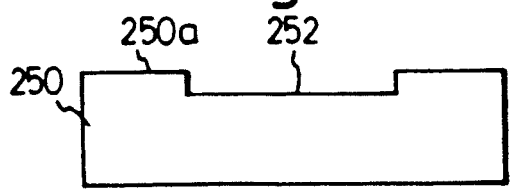
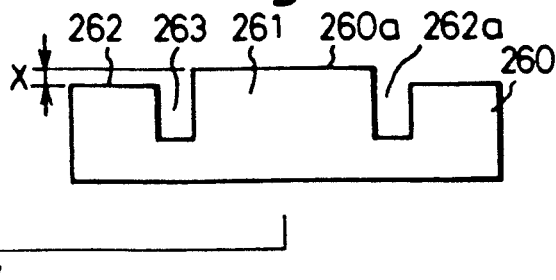
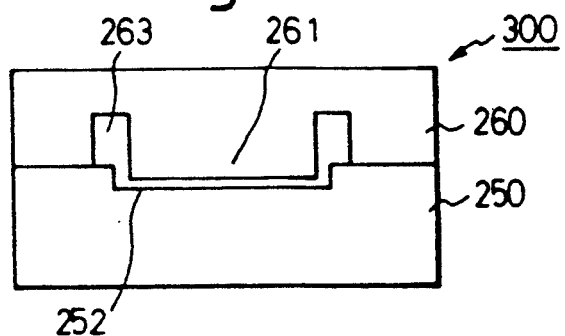
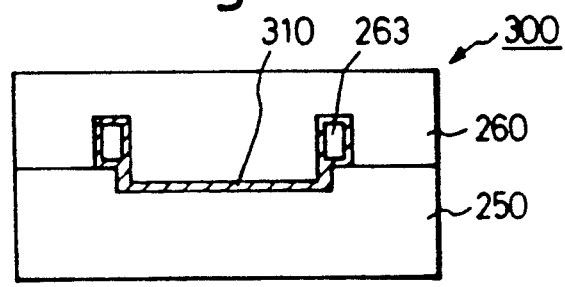
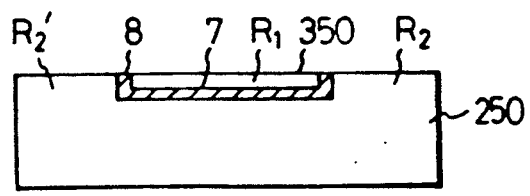

SEMICONDUCTOR CIRCUIT STRUCTURE AND METHOD FOR MAKING THE SAME

This is a division of application Ser. No. 07/415,132, filed Sep. 29, 1989, now abandoned.

BACKGROUND OF THE INVENTION

1. Field of the Invention

The present invention relates to a semiconductor circuit structure in which a plurality of elements are formed on a plurality of regions formed on at least one surface of a semiconductor substrate, and isolated from each other and a method for making the semiconductor circuit structure, and more particularly relates to a semiconductor circuit having an element isolating structure with high withstanding voltage characteristics.

2. Description of the Related Art

When an element isolating structure having an especially high withstand voltage is required, for example, when a high withstand voltage power element and logic circuits are formed on one chip, use is made of isolation utilizing PN junctions or utilizing insulating materials.

In the element isolating method utilizing a PN junction, an N-type epitaxial layer is first formed on a P-type semiconductor substrate, then a P+ layer is provided in the epitaxial layer extending from the top surface thereof to the top surface of the P-type semiconductor substrate by a diffusion method.

By utilizing the P+ layer, the portion on which a power element is to be mounted and the portion on which a logic circuit is to be mounted are isolated from each other.

Accordingly, in this method, the region on which a logic circuit is to be being mounted is surrounded by the P+ layer, thereby PN-junctions are formed therebetween.

When reverse bias is applied to the PN-junction, a depletion layer is formed, causing the region on which a logic circuit is to be mounted to be isolated from other regions.

This method can be carried out at a low cost, but a problem arises in that when a power element having a withstand voltage more than 300 V is formed on the substrate, the depth of the diffusion layer for the isolation has to be more than 40 $\mu$m.

This makes the time for making such an element isolating structures extremely long.

Further, the width of the diffusion is increased, increasing the loss of the area available for forming elements.

In the element isolating method utilizing an insulating material, first, a groove is formed on a predetermined region on an N-type semiconductor substrate by selective etching.

Then, a thermal oxide film is formed on the top surface of the substrate, then a polycrystalline silicon layer is deposited on the surface of the oxide film. Finally, part of the N-type semiconductor substrate is removed from the back surface to the groove by grinding.

Accordingly, the region surrounded by the groove, of the N-type semiconductor substrate, is completely isolated by an insulating material and it can possess a high isolated withstand voltage.

There is another method for element isolation using an insulating material wherein two semiconductor substrate layers are directly and integratedly joined via an insulating film and then one surface of the resultant joined substrate is selectively etched to form an isolating groove, the top end thereof extending to the insulating film.

As thermal oxide film is formed thereon, then a polycrystalline silicon layer is deposited on the oxide film to bury the groove.

The polycrystalline silicon layer is then removed from the surface thereof.

As a result, the region surrounded by the groove is isolated from other regions by the insulating material.

These methods for isolating elements by an insulating material have the advantage that an isolation region having a desired concentration of impurities and thickness can be obtained, but has the disadvantage that a vertical type power element in which the back surface of the semiconductor substrate is used as a current passage, cannot be produced, because one of the main surfaces of the substrate is insulated.

SUMMARY OF THE INVENTION

Therefore, the object of the present invention is to provide a semiconductor circuit structure by which, for example, a vertical type power element using the back surface of the substrate as a current passage can be produced and an isolated region having a high withstand voltage with almost no transverse diffusion can be produced in a short period.

Another object of the present invention is to provide a method for making the above semiconductor circuit structure.

To attain the first object of the present invention, there is provided a semiconductor circuit structure which includes a semiconductor substrate portion and at least one region provided on one main surface thereof insulatedly isolated from other regions on the same surface by a burying means made of an oxide film, the burying means including a bottom flat portion and at least one side wall portion provided at least in the vicinity of an edge portion of and integrally formed with the bottom flat portion.

To obtained the second object of the present invention, there is provided a method for making the semiconductor circuit structure including the steps of:

preparing a first semiconductor substrate layer having a mirror polished main surface and a second semiconductor substrate layer having a mirror polished main surface;

forming a concave portion on the mirror polished main surface of either of said first and said second semiconductor substrate layers;

forming a groove having a length longer than the depth of the concave portion and extending into either the substrate layer at a portion in the vicinity of an end portion of the concave portion or another substrate layer to be stacked on the semiconductor substrate layer at a position opposite to the place in the vicinity of an end portion of the concave portion;

forming a semiconductor substrate portion by placing the two separate semiconductor substrate layers in close contact with each other, so that the mirror polished main surfaces of the two semiconductor substrate layers are brought into contact with each other, by utilizing a direct contacting method to form a vacant portion at least between the bottom surface of the concave portion formed on a semiconductor substrate layer and the surface of the other semiconductor substrate layer and being communicated with the groove;

filling the vacant portion, including the groove, with an oxide to form a burying means serving as an insulating layer; and removing the part of the semiconductor substrate layer in which the groove is provided from a free end surface thereof, so that at least a part of the groove is uncovered on the thus treated surface to form a region insulatedly isolated from other regions and surrounded by the burying means.

Since the semiconductor circuit structure has an element isolating region which is insulatedly isolated from other regions by an oxide film formed on one main surface of the substrate, a vertical power element can be formed in a region other than the element isolating region produced above.

Moreover, the element isolating region, i.e., insulatedly isolated region, can be formed in a short period because it is formed by only an oxide film.

In addition, an insulatedly isolated region having a high withstand voltage can be obtained, because it has less transverse diffusion portions, which usually appear when impurities are diffused in a substrate.

BRIEF DESCRIPTION OF THE DRAWINGS

FIGS. 5(a) to 5(e) are diagrammatic views of the production steps of a third embodiment of the present invention;

FIGS. 6(a) to 6(e) are diagrammatic views of the production steps of a fourth embodiment of the present invention.

DESCRIPTION OF THE PREFERRED EMBODIMENTS

Preferred embodiments of the present invention will now be explained with reference to the attached drawings.

As explained above, the semiconductor circuit structure of the present invention is useful for an integrated circuit in which a plurality of regions are provided on the surface of a semiconductor substrate, the respective regions are isolated from each other, and a plurality of elements such as logic circuit and power elements, are formed in the regions.

The invention is characterized in that the insulatedly isolated regions are formed by just a burying means such as a film-like portion made of an oxide.

Therefore, the method for making the semiconductor circuit structure includes as a characteristic features the step in which a burying means having a special configuration is formed in a semiconductor substrate portion.

Further, in the method of the present invention, at least two different kinds of semiconductor substrate layers are used, i.e., for embodiment, one semiconductor substrate layer has a certain concentration of impurities and another semiconductor substrate layer has a different concentration.

In this invention, the first and second semiconductor substrate layers are not limited to any specific concentration or to any conductivity.

Each semiconductor substrate layer may have the concentration and conductivity desired to attain the objects of the present invention.

For example, as shown in the embodiment, one semiconductor substrate layer may have an $N^+$ type conductivity and another may have an $N^-$ type of the conductivity.

It is apparent, however, that semiconductor substrate layers having a P type conductivity and a different concentration of the impurities may be used and, further, if permitted, the semiconductor substrate layers having different conductivity from each other, for example, an N type and P type, may be used.

Moreover, in the present invention, each of two different kinds of semiconductor substrates may have a mirror polished surface at least on one main surface.

Figure 1A:
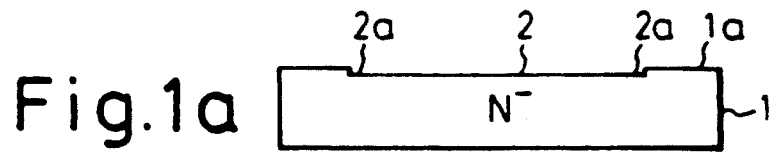
FIGS. 1(a) to 1(f) are diagrammatic views of the production steps of the first embodiment of the present invention.
Figure 1B:
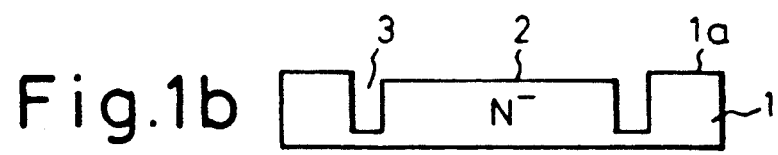
Figure 1C:
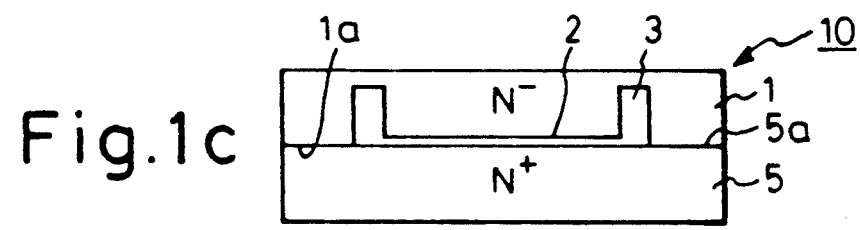

FIGS. 1(a) to 1(b) are cross-sectional views indicating the process steps for making a semiconductor circuit structure of the present invention.

In this embodiment, a first semiconductor substrate layer 5 consisting of an $N^+$ type semiconductor substrate layer, at least one surface thereof mirror polished, and a second semiconductor substrate layer 1 consisting of an $N^-$ type semiconductor substrate layer, at least one surface thereof mirror polished, are prepared.

The concentration of the first and the second semiconductor substrate layers may be exchangeable with each other if necessary.

As shown in FIG. 1(a), a concave portion 2 having a depth of 0.2 to 2 $\mu$m is formed on the mirror polished main surface of the second semiconductor substrate 1 having a conductivity of $N^-$ by selectively etching a portion of the mirror polished main surface by a chemical etching or reactive ion etching (RIE) method.

Then, as shown in the FIG. 1(b), a groove 3, open on the bottom surface of the concave portion 2 and having a width more than 2 $\mu$m and a depth measured from the main surface of more than 2 $\mu$m, is formed along a boundary portion 2a of the concave portion 2 by a dicing method, chemical etching method or RIE method.

The groove 3 extends into the second semiconductor substrate layer 1, preferably perpendicular to the bottom surface of the concave portion 2. The groove 3 has openings on a side wall of the substrate 1 for introducing oxygen gas thereinto during an oxidizing process.

After that, both the $N^+$ type first semiconductor substrate 5 and the $N^-$ type second semiconductor substrate 1 are treated by carrying out the following steps in turn to fully clean the surface.

Boiling with trichloroethylene, such as "Trichlene" or the like.

Ultrasonic cleaning with acetone

Removing organic substances therefrom utilizing a mixture of $NH_3$, $H_2O_2$, and $H_2O$ ($NH_3:H_2O_2:H_2O = 1:1:4$)

Removing contamination caused by metallic substances therefrom utilizing a mixture of HCl, $H_2O_2$, and $H_2O$ (HCl:$H_2O_2$:$H_2O = 1:1:4$)

Cleaning with pure water.

After these operations, a step for removing an oxide film caused by natural oxidation is carried out utilizing a mixture of HF and $H_2O$ (HF:$H_2O = 1:50$) and thereafter a step for forming an oxide film having a thickness of less than 15Å on a surface of a wafer utilizing, for embodiment, a mixture of $H_2SO_4$ and $H_2O_2$ ($H_2SO_4$:$H_2O_2$=3:1) are carried out to give the surface of the wafer a hydrophilic property.

Then, a step for cleaning with pure water is again carried out.

Finally, these substrates are dried with dry nitrogen or the like to control the amount of moisture absorbed in the surface of these substrates.

After these treatments, these semiconductor substrates 1 and 5 are brought into contact with each other with the mirror polished main surface 1a of the substrate 1 and the mirror polished main surface 5a of the substrate 5 closely connected to each other to form a semiconductor substrate portion 10.

The two semiconductor substrates 1 and 5 are adhered by hydrogen bonds created between silanol radicals formed on the surface of the semiconductor substrates and molecules of water.

The semiconductor substrates 1 and 5 of the semiconductor portion 10 are dried in a vacuum chamber with vacuum of less than 10 Torr.

At that time, a load of more than 30 g/cm$^2$ may be applied for compensating for deformation due to the treatment in the vacuum chamber.

Then, the semiconductor substrates 1 and 5 are subjected to heat treatment in an inert gas atmosphere such as nitrogen or argon at a temperature of more than 1100° C. for more than 1 hour to cause dehydration condensation, whereby Si-O-Si bonds are created.

When oxygen (O) is further diffused into the substrate, Si-Si bonds are created, whereby the two semiconductor substrates 1 and 5 are directly bonded by a wafer direct, bonding, method (WDB) to form a single semiconductor substrate portion 10.

At this stage, the concave portion 2 formed on the surface of the second semiconductor substrate 1 is not connected to the opposite surface of the first semiconductor substrate 5, leaving a vacant portion therebetween.

Figure 1D:
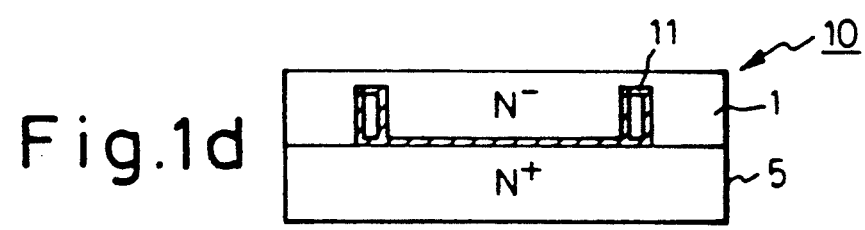

In the next step, as shown in FIG. 1(d), the semiconductor substrate portion 10 is subjected to heat treatment in an oxidizing gas atmosphere such as, a mixed combustion gas consisting of dry $O_2$, wet $O_2$, or $H_2$ and $O_2$ at a temperature of more than 900° C. for more than 1 hour to oxidize the inside surface of the vacant portion through the groove 3 to form an oxide film 11 thereon.

This oxidation treatment should be continued until the oxide film formed on the surface of the semiconductor substrate 1 at the bottom portion of the concave portion 2 and the oxide film formed on the surface of the semiconductor substrate 5 opposite to the concave portion 2 grow enough to completely bury the cavity portion and to attain complete adherence with the Si-O bonds to. This forms the cavity or space inside the grooves.

To improve the oxidation speed of the concave portion 2 in the steps shown in FIGS. 1(a) and 1(b), oxygen may be injected into the surface of the concave portion 2 for promoting the oxidation by an ion implantaion method before the contacting operation.

Figure 1E:
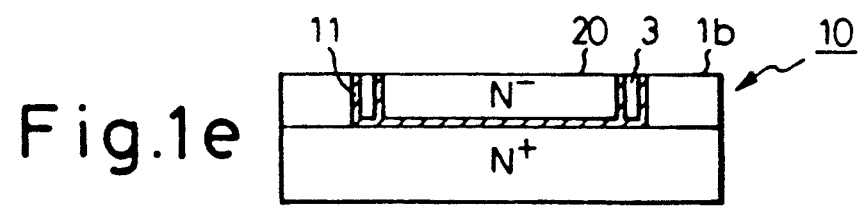

As shown in FIG. 1(e), a part of the portion of the second semiconductor substrate 1 is then removed from the surface opposite to surface contacting the first semiconductor substrate 5 by grinding, polishing, or etching until a part of the groove 3, the inside wall of which is covered with an oxide film 11, appears on the thus treated surface 1b of the semiconductor substrate 1.

Figure 1F:
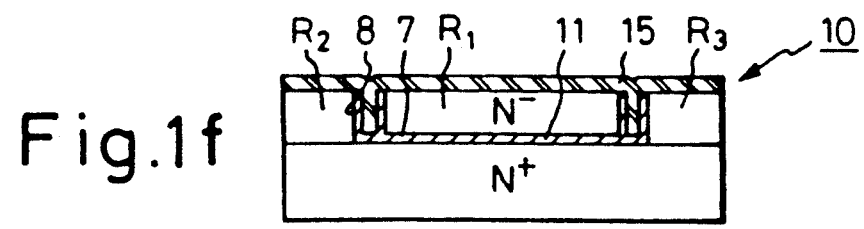

As shown in FIG. 1(f), polycrystalline silicon 15 is deposited on the surface 1b by the CVD method to bury the groove 3.

Note that, in this example, while polycrystalline silicon is used to bury the groove 3, an oxide, nitride, or other insulating substance may be used.

Also any one of sputtering, vapor deposition and SOG may be used for burying the groove.

It is required that at least the opening of the groove 3 formed in the surface 1b of the substrate 1 be closed.

The inside of the groove 3 need not necessarily be filled completely with the burying material 11 or 15 of oxide, nitride or polycrystalline silicon, i.e., a cavity may remain in the groove 3.

After that, debris on the surface of the semiconductor substrate is removed and the surface smoothed by lap polishing, etch-back, etc., thereby giving a semiconductor substrate portion 10 having a region R1 completely and electrically isolated from other regions R2 and R3 by a burying material 11 or 15 such as an oxide, nitride, or polycrystalline silicon.

When predetermined element, for example, logic circuits or power elements are provided in the regions, a desired semiconductor circuit structure can be obtained.

FIG. 2 (a) is a cross-sectional view of the semiconductor circuit structure produced by the method disclosed above.

Figure 2A:
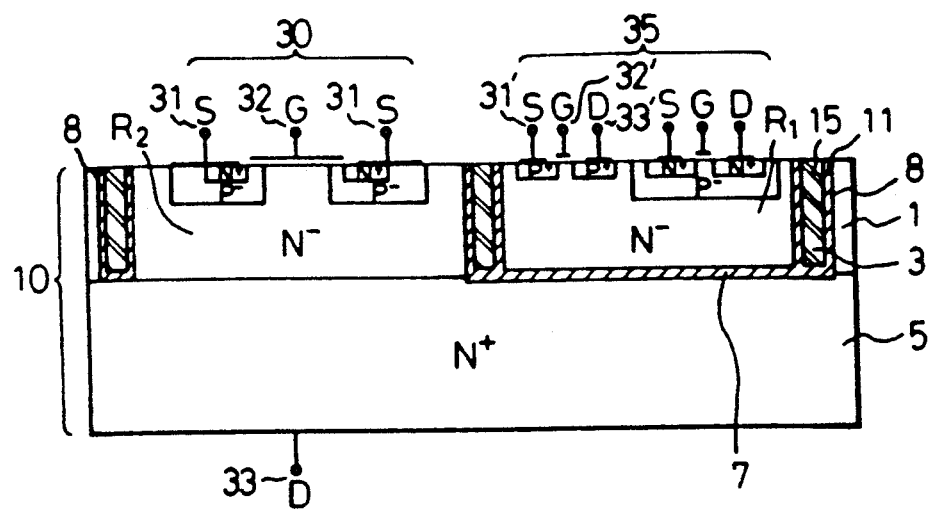
FIGS. 2(a) and 2(b) are cross-sectional views of the present invention.

In FIG. 2(a), a transistor 30 is provided on the surface of the region R2 of the semiconductor substrate portion 10 to make a vertical power transistor.

Transistors 35 are provided on the surface of the region R1, electrically isolated from the region R2, to from a controlling transistor portion to control the power transistor.

The power transistor 30 is provided with a source electrode 31 and a gate electrode 32 on the top surface of the second semiconductor substrate layer 1 and is provided with a drain electrode 33 on the back surface of the first semiconductor substrate layer 5.

On the other hand, in the logic circuit 35, a source electrode 31', a gate electrode 32', and a drain electrode 33' are arranged in the same surface of the region R1 of the semiconductor substrate layer. 1.

In this embodiment, the semiconductor substrate portion 10 is produced by directly bonding the first N$^+$ type semiconductor substrate layer 5 having a high concentration of impurities and the second N$^-$ type semiconductor substrate layer 1 having a low concentration of impurities.

The logic circuit 35 is formed in the region R1 of the semiconductor substrate layer 1 of the semiconductor substrate portion 10.

The region R1 is insulatingly isolated from other regions R2 or R3 of the semiconductor substrate layer 1 by a silicon oxide film 11 and burying substance 15.

Accordingly, the isolated region R1 has a good element characteristic because the region is formed with a single crystal substrate and has a high withstand voltage and superior heat resistance because of the region R1 being insulatedly isolated by the insulating layer 11 from the region R2 on which the transistor 30 is mounted.

Further, since a part of the isolating groove 3 is exposed at the surface of the semiconductor substrate layer 1, the alignment between the isolated region R1 and the elements formed on the surface thereof is simplified.

FIG. 2 (b) is a cross-sectional view of the semiconductor circuit structure produced by the method of another embodiment of the present invention.

Figure 2B:
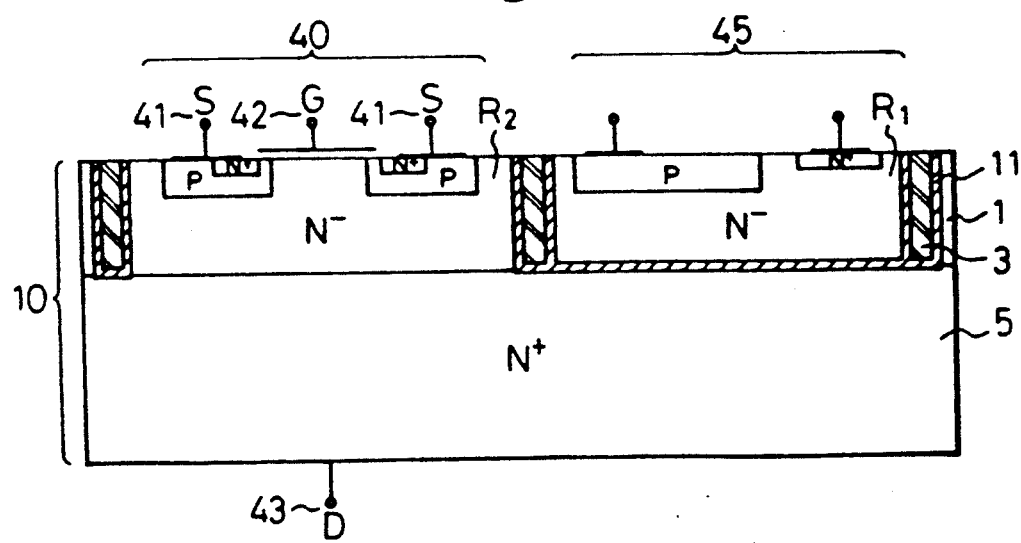

In FIG. 2(b), a vertical power MOS transistor 40 and a photo diode 45 are mounted on one chip.

Electromotive force is generated from the photo diode 45 by a light beam radiated as an input signal from an LED or the like.

The transistor 40 is energized utilizing the electromotive force as a gate voltage.

The diode 45 is insulatedly by the insulating layer 11.

It possesses a large isolating withstand voltage since leakage of electric current caused by photo electric current, appearing in an isolating structure utilizing a PN junction, does not exist.

Figure 3A:
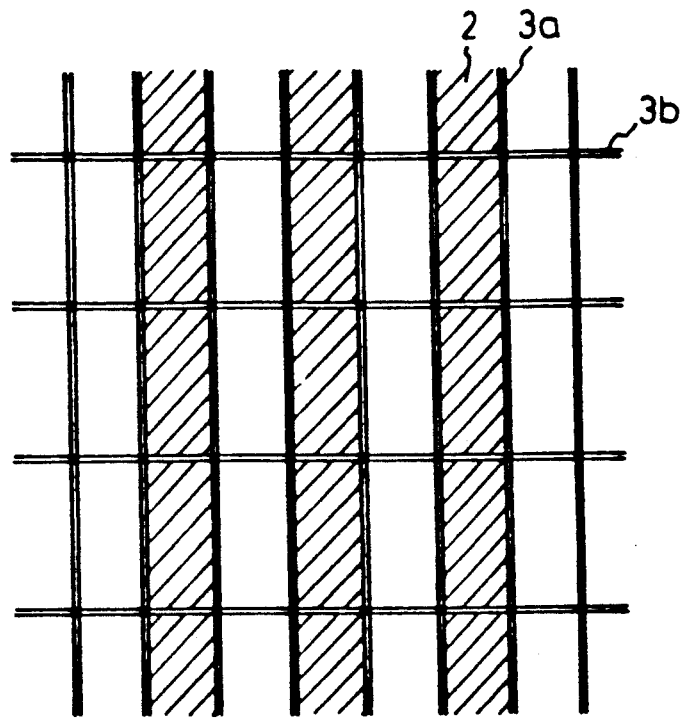
FIGS. 3(a) and 3(b) are plane views of the arrangement of concave portions and grooves formed in the production steps of the embodiment of the present invention.
Figure 3B:
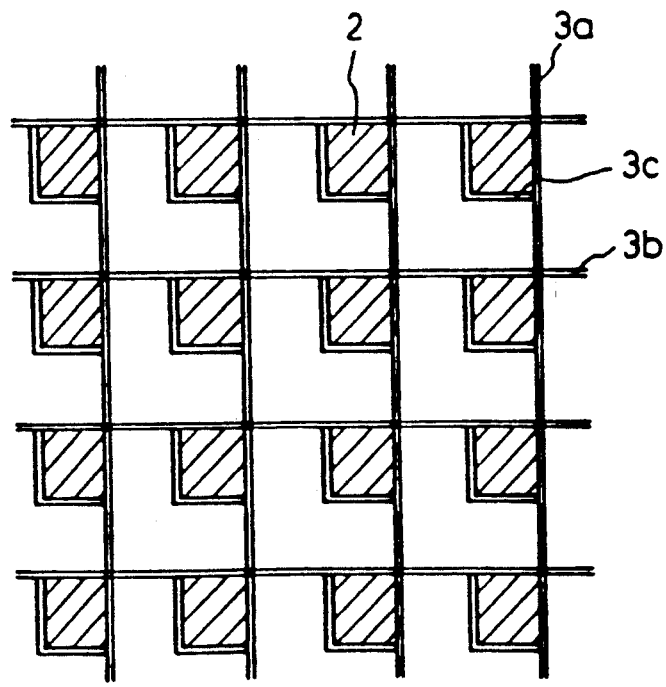

FIGS. 3(a) and 3(b) are plane views of the concave portion and the groove used in the first embodiment.

In FIG. 3(a), the concave portions 2 are provided in the form of stripes on a surface of the semiconductor substrate layer 1.

The grooves 3a are provided along the side lines of the concave portions 2.

Separate grooves 3b are provided in a direction perpendicular to the groove 3a at a space a whole multiple of the chip size therebetween.

However, if the case permits, the grooves 3b may be omitted.

In FIG. 3(b), the concave portions 2 are provided in the form of islands on a surface of the semiconductor substrate layer 1.

The grooves 3a, 3b, and 3c are provided along the boundaries of the concave portion 2.

The groove 3a and 3b are provided perpendicular to each other.

The ends are opened to the air at the ends of the substrate. The island like concave portions, however, may have any configuration.

In this embodiment, the semiconductor substrate portion 10 was provided as a combination of a first semiconductor substrate layer 5, i.e., an N+ type substrate layer, and a second semiconductor substrate layer 1, i.e., an N− type substrate layer.

The concentration of the impurities thereof was optional, and further, each semiconductor substrate layer had a different conductivity from the other.

Moreover, a semiconductor substrate layer in which impurities are diffused in all or part of the surface may be used.

Further, a semiconductor substrate portion 10 produced by connecting two of more semiconductor substrate layers may be used.

Accordingly, in this invention, a semiconductor circuit structure can be produced from any configuration of semiconductor substrate portions.

Therefore, a semiconductor circuit structure including a layer having a low concentration of impurities with a relatively high thickness can be easily produced, thus contributing to making elements having high withstand voltages.

In the first embodiment explained above, the elements used therein were insulated gate type elements, but the element used in the present invention are not restricted.

Any kind of element such as diodes, bi-polar devices or thyristers, for example, can be used.

The semiconductor circuit structure of this invention thus produced has a region R1 formed on one main surface of the semiconductor substrate portion 10. The region R1 is insulatedly isolated from other regions R2 or R3 by a burying means 11 made of an insulating material, for example, an oxide film.

The burying means 11 includes a bottom flat portion 7 and at least one side wall portion 8 provided on at least one edge portion of and integrally formed with the bottom flat portion 11.

In this embodiment, the side wall portion 8 was formed at just the end portion of the bottom portion 7 of the burying means 11, but it may also be formed in the vicinity of the end of the bottom portion thereof.

Also the side wall 8 in this embodiment was formed perpendicular to the bottom surface of the burying means 11.

However, it may be formed with a certain angle to the surface of the burying means 11 other than a right angle. Further, the side wall 8 was duplicately formed, i.e., two side walls 8 and 8' were adjacently arranged, and the space formed therebetween, was filled with another insulating material, for example, polycrystalline silicon but a single side wall portion having a thin width the same or nearly the same as the thickness of the bottom portion of the burying means 11 can be used.

FIGS. 4(a) to 4(f) are the cross-sectional views of the process steps of a second embodiment of the present invention.

Figure 4A:
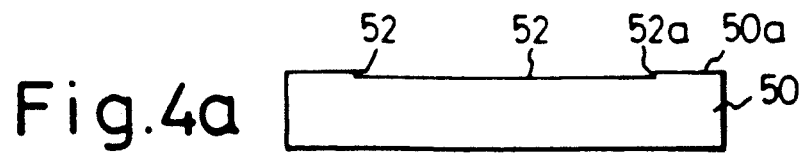
FIGS. 4(a) to 4(f) are diagrammatic views of the production steps of a second embodiment of the present invention.

In the second embodiment, as shown in FIG. 4(a), a concave portion 52 having a depth of 0.2 to 2 $\mu$m is provided on a mirror polished surface 50a of a second semiconductor substrate layer 50.

Figure 4B:
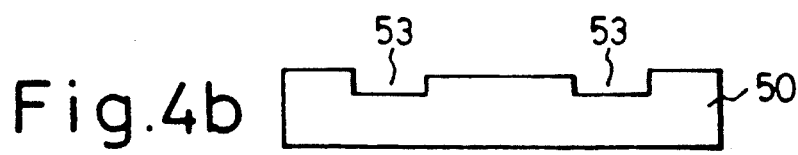

As shown in FIG. 4(b), separate concave portions 53 or grooves are provided at a boundary of the concave portion 52 to a depth of more than 2 $\mu$m deeper than the concave portion 52 and opening on the bottom surface of the concave portion 52. As explained later, the groove 53 serves as a passage to introduce oxygen into an inside position of the substrate and has an opening at the end of the substrate.

Figure 4C:
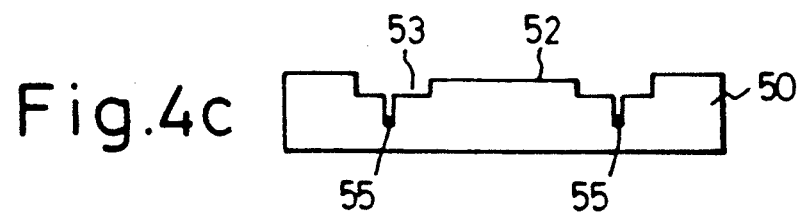

As shown in FIG. 4(c), narrow grooves 55 are provided at the bottom portion of the grooves 53 downwardly extending into the second semiconductor substrate layer 50, preferably perpendicular to the bottom surface thereof.

The narrow grooves 55 have a width of 0.2 to 2 $\mu$m and a depth of more than 2 $\mu$m and much deeper than the grooves 53.

In this embodiment, the narrow grooves 55 may be provided anywhere at the bottom surface of the grooves 53.

Figure 4D:
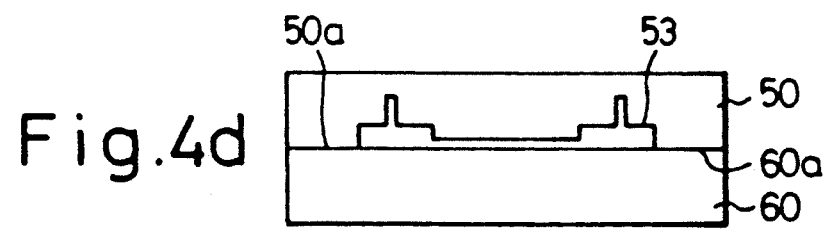

As shown in FIG. 4(d), the substrate layers are cleaned in the same manner as explained in the first embodiment, then the first semiconductor substrate layer 60 and the second semiconductor substrate layer 50 are brought into contact so that the mirror polished surface 60a of the first semiconductor substrate layer 60 and that 50a of the semiconductor substrate layer 50 are directly connected to each other as in the same manner as described in the first embodiment to produce a single semiconductor substrate portion 100 having a cavity formed by the grooves 55, the narrow grooves 53, and the space defined by the top surface of the first semiconductor substrate layer 60 and the bottom surface of the concave portion 52.

Figure 4E:
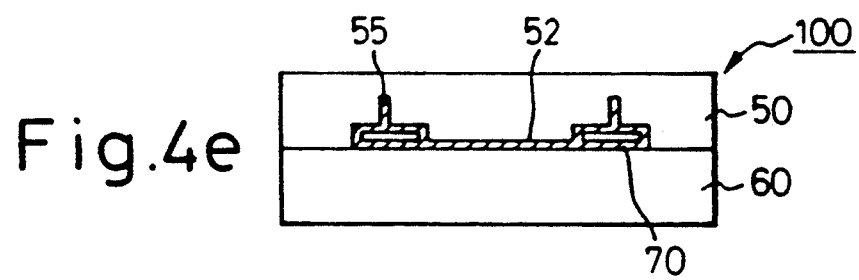

As shown in FIG. 4(e), the inside portion of the cavity is oxidized by an oxidation process through the grooves 53 so as to bury the narrow grooves 55 and the space defined by the top surface of the first semiconductor substrate layer 60 and the bottom surface of the concave portion 52 with an oxide.

The inside surfaces of the grooves 53 are covered by an oxide film 70 with a remaining space, or cavity therein.

Thereafter, the two substrates are fixedly adhered to each other.

Figure 4F:
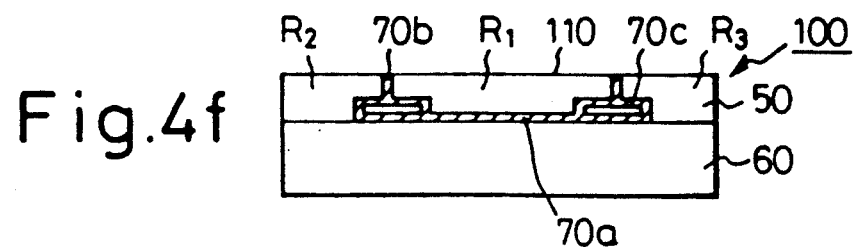

As shown in FIG. 4(f), the free end surface of the second semiconductor substrate layer 50 is then grounded or etched until a part of the narrow grooves 55 appears on the thus treated surface, thereby obtaining a region R1 which is insulatedly isolated from the other regions R2 and R3 by the oxide film 70.

In this embodiment, as shown in FIG. 4(e), the narrow grooves 55 and the space defined by the top surface of the first semiconductor substrate layer 60 and the bottom surface of the concave portion 52 are buried with an oxide such as an oxide film, so an operation for burying the spaced portions with some insulating materials after the grinding or etching operation is not required.

As shown in FIG. 4(f), in the semiconductor circuit construction obtained in the second embodiment, the semiconductor substrate portion 100 includes an N+ type semiconductor substrate layer 60 as the first semiconductor substrate layer and an N− type semiconductor substrate layer 50 as the second semiconductor substrate layer.

In the second semiconductor substrate layer 50, a plurality of regions are provided and a region R1 made of an N− type semiconductor substrate layer is electrically isolated from other regions R2 and R3, also made of N− type semiconductor substrate layers by burying means 70, for example, an oxide film, comprising a bottom portion 70a provided on the surface of the first semiconductor substrate layer 60, with step like portions 70c provided at the two ends thereof and side wall portions 70b projecting upwardly from the top surface of the step like portions 70c.

FIGS. 5(a) to 5(e) are cross-sectional views of the process steps of a third embodiment of the present invention.

In this embodiment, as shown in FIGS. 5(a) and 5(b), first and second semiconductor substrate layers 160 and 150 are at first prepared.

The first semiconductor substrate layer 160 has a mirror polished surface 160a and there on, a groove 162 having a depth and width more than 2 μm and opening on the mirror polished surface. As explained later, the groove 162 serves as a passage to introduce oxygen into an inside position of the substrate and has an opening at the end of the substrate.

The second semiconductor substrate layer 150 has a mirror polished surface 150a and thereon, a concave portion 152 having a depth of 0.2 to 2 μm and narrow grooves 153 extending downwardly into the substrate 150 from the two end portions of the concave portion 152.

The two substrates 150 and 160 are then subjected to the same cleaning operation as explained in the first embodiment.

The substrates 150 and 160 are then brought into contact so that the mirror polished surfaces 150a and 160a oppose each other face to face and the concave portion 152 and grooves 162 are oppositely arranged, in the same manner as in the first embodiment.

As shown in FIG. 5(d), the inside portion of the space formed in the assembly is oxidized by a suitable oxidizing process through the groove 162.

The narrow grooves 153 and the space defined by the top surface of the first semiconductor substrate layer 160 and the bottom surface of the concave portion 152 are thereby buried with an oxide 210 such as an oxide film, while the inside surface of the groove 162 is covered with the oxide film, leaving a space or cavity inside.

Thereafter the two substrates are fixedly adhered to each other to form the single semiconductor substrate portion 200.

As shown in FIG. 5(e), the free end surface of the second semiconductor substrate layer 150 is then grounded or etched until a part of the narrow grooves 153 appears on the thus treated surface.

Therefore a region R1 is obtained which is insulatedly isolated from the other regions R2 and R3 by the oxide film 210.

In the third embodiment, an operation for burying the spaced portions with some insulating materials after the grinding or etching operation is not also required.

FIGS. 6(a) to 6(e) are the cross-sectional views of the process steps of the fourth embodiment of the present invention.

In this embodiment, as shown in FIGS. 6(a) and 6(b), a first semiconductor substrate layer 250, having a mirror polished surface 250a and a first concave portion 252, and a second semiconductor substrate layer 260, having a mirror polished surface 260a and a projecting portion 261 projecting from a mirror polished surface 262 with a height less than the depth of the first concave portion 252 by 0.2 to 2 μm and having grooves 263 extending downwardly into the semiconductor substrate layer 260 at the two boundary end portions of the projecting portion 261, are prepared.

In the second semiconductor substrate layer 260, the grooves have a depth of more than 2 μm from the surface 262 of the substrate 260 and a width of more than 2 μm.

In this embodiment, the width of the projecting portion 261 having a mirror polished surface 260a, formed on the surface of the second semiconductor substrate layer 260, may be less than the width of the concave portion 252 formed on the first semiconductor substrate layer 250 by 0.4 μm or more, so that the projecting portion 261 is inserted into the concave portion 252 when the two substrates are brought in contact with the mirror polished surfaces opposing each other.

As shown in FIG. 6(c), the first semiconductor substrate layer 250 and the second semiconductor substrate layer 260 are brought into contact with each other with the two mirror polished surfaces 250a and 262 directly bonded, in the same manner as in the first embodiment, so that the projecting portion 261 is inserted into the concave portion 252 of the first semiconductor substrate layer 250.

This gives a single semiconductor substrate portion 300.

In this embodiment, the mirror polished surfaces 250a and 262 of the semiconductor substrate layers 250 and 260 may be brought into contact with an oxide film formed therebetween.

As shown in FIG. 6(d), an oxidizing operation is then carried out through the groove 263 to oxidize the inside wall portion of the cavity formed in the semiconductor substrate portion 300.

The cavity portion 253, except the groove 263, is buried with the oxide film 310 to closely adhere the substrates to each other.

In the groove 263, the inside wall is covered with the oxide film, although the central part of the inside of the groove 263 remains vacant to form a cavity.

Thereafter, the free end surface of the second semiconductor substrate layer 260 is grounded or etched until the surface of the first semiconductor substrate layer 250 is uncovered.

This gives a region R1 which is insulatedly isolated from the other regions R2 and R2' by the oxide film 310.

In this embodiment, the first semiconductor substrate layer 250 may be an $N^+$ type semiconductor substrate layer while the second semiconductor substrate layer 260 may be an $N^-$ type semiconductor substrate layer, or vice versa, giving the region R1 a different amount of impurities from the other regions.

In the final product, i.e., the semiconductor circuit structure, the semiconductor substrate portion 300 mainly consists of the semiconductor substrate layer 250 having a surface divided into a plurality of regions, one region R1 electrically and insulatedly isolated from other regions R2 and R2' by burying means made of, for example, an oxide film comprising a bottom portion 7 and side wall portion 8.

The region R1 may also be made of an $N^-$ type semiconductor substrate layer, while the other regions R2 and R2' may be made of $N^+$ type semiconductor substrate layer.

Further, for the substrate 250, use may be made of a diffusion wafer or directly adhered wafer forming a layer of a high concentration of impurities on a semiconductor substrate layer having a low concentration of impurities.

This is especially effective when a high withstand voltage power element and an insulated isolating region formed by a thin film are both mounted on one chip.

We claim:

1. A method of producing a semiconductor circuit structure, comprising the steps of:
    providing a first semiconductor substrate layer and a second semiconductor substrate layer, each having a main surface;
    forming a concave portion on a main surface of one of said first and said second semiconductor substrate layers;
    forming a groove extending into either said first semiconductor substrate layer at a position near an edge portion of said concave portion or said second semiconductor substrate layer to be stacked on the other semiconductor substrate layer at a position opposite to a place near the edge portion of said concave portion when it is placed in contact with the first semiconductor substrate, said groove having an opening on a side wall of said semiconductor substrate layer for introducing oxygen gas thereinto;
    forming a semiconductor substrate portion by said placing in contact said main surfaces of said first and second semiconductor substrate layer with each other, thereby forming a vacant portion at least between the bottom surface of said concave portion on either of the semiconductor substrate layers and the main surface of said other semiconductor substrate layer being communicated with said groove;
    filling at least said vacant portion with an oxidized material to form a buried layer serving as an insulating layer and forming an oxide film at least on the inside wall of said groove, and
    removing a part of the semiconductor substrate layer in which said groove is provided, from a free end surface thereof, so that at least a part of said groove is uncovered to form a region insulatedly isolated from other regions and surrounded by said buried layer.

2. A method for producing a semiconductor circuit structure according to claim 1, wherein said first and second semiconductor substrate layers have different concentrations of impurities.

3. A method for producing a semiconductor circuit structure according to claim 1, wherein said first and second semiconductor substrate layers have different conductivities.

4. A method for producing a semiconductor circuit structure according to claim 1, wherein the depth of said groove is deeper than the depth of said concave portion.

5. A method for producing a semiconductor circuit structure according to claim 1, wherein said filling step includes flowing an oxidizing agent at least in said concave portion at said contacting step.

6. A method of producing a semiconductor circuit structure according to claim 1, comprising the step of mirror polishing at least one of said main surfaces of said semiconductor substrate layers.

7. A method of producing a semiconductor circuit structure comprising the steps of:
    providing a first semiconductor substrate layer and a second semiconductor substrate layer;
    forming a concave portion on a main surface of said second semiconductor substrate layer;
    forming a groove extending from a bottom of said concave portion into said second semiconductor substrate layer, said groove having a depth measured from the main surface of said second semiconductor layer deeper than the depth of said concave portion, and said groove extending laterally in said second semiconductor layer to open on a side wall of said semiconductor substrate layer for introducing oxygen gas thereinto;
    forming a semiconductor substrate portion by directly connecting said main surface of said second semiconductor substrate layer to a main surface of said first semiconductor substrate layer to form a vacant portion defined between a bottom surface of said concave portion and the main surface of said first semiconductor substrate layer;
    filling at least said vacant portion with an oxidized material to form a buried layer serving as an insulating layer and forming an oxide film at least on an inside wall of said groove, and
    removing a part of the semiconductor substrate layer in which said groove is provided, from a free end surface thereof, to uncover a portion of said groove and to form a region insulatedly isolated from other regions by a film-shaped material formed of said buried layer formed in said second semiconductor substrate.

8. A method for producing a semiconductor circuit structure according to claim 7, wherein at least one of said semiconductor substrates has a mirror polished surface.

9. A method of producing a semiconductor circuit structure according to claim 7, further comprising the additional step, after the step of forming said concave portion on said second semiconductor substrate layer, of forming a groove near the edge portion of said concave portion having a depth greater than the depth of said concave portion;
   forming narrow grooves to extend into said second semiconductor substrate layer from the bottom of said groove, and
   conducting an oxidizing process to fill said vacant portion and said narrow groove with oxidized material, and to cover an inside wall of said groove with an oxide film, for oxidizing said inside surface thereof while leaving a cavity inside thereof.

10. A method for producing a semiconductor circuit structure according to claim 9, wherein at least one of said semiconductor substrates has a mirror polished surface.

11. A method of producing a semiconductor circuit structure according to claim 7, further comprising the additional steps of forming a second groove on the main surface of said first semiconductor substrate layer, an opening of which is arranged to face said concave portion formed in said second semiconductor substrate layer and to form a vacant portion defined between a bottom surface of said second groove and a bottom surface of said concave portion when said main surfaces of said two semiconductor substrate layers are brought into contact with each other, and covering at least an inside wall of said groove with an oxide material while leaving a cavity inside thereof in said step of filling at least said vacant portion with an oxidized material to form a buried layer serving as an insulating layer and forming an oxide film at least on an inner side wall of said second groove.

12. A method of producing a semiconductor circuit structure comprising the steps of:
   providing a first semiconductor substrate layer and a second semiconductor substrate layer;
   forming a concave portion on a main surface of said first semiconductor substrate layer;
   forming a projecting portion on a main surface of said second semiconductor substrate layer having a height less than the depth of said concave portion, and said projecting portion having a configuration such that it can be inserted into said concave portion;
   forming a groove along a boundary portion of said projecting portion in said second semiconductor substrate layer and extending thereinto;
   forming a semiconductor substrate portion by directly connecting said first and said second semiconductor substrate layer so that said projecting portion is inserted into said concave portion to form a vacant portion defined by the bottom surface of said concave portion and a top surface of said projecting portion;
   filling at least said vacant portion with an oxidized material to form a buried layer serving as an insulating layer and forming an oxide film at least on an inside wall of said groove, and
   removing a part of said second semiconductor substrate layer from a free end surface thereof to uncover said main surface of said first semiconductor substrate layer outside of said concave region to form a region made of said second semiconductor substrate layer insulatedly isolated from other regions made of said first semiconductor substrate layer by a film-shaped portion including said buried layer formed in said first semiconductor substrate.

13. A method for producing a semiconductor circuit structure according to claim 12, wherein at least one of said semiconductor substrates has a mirror polished surface.

* * * * *